(12) United States Patent
Uesugi et al.

(10) Patent No.: US 6,643,816 B1
(45) Date of Patent: Nov. 4, 2003

(54) TRANSMITTING APPARATUS AND ERROR HANDLING METHOD IN TRANSMITTING APPARATUS

(75) Inventors: Kouki Uesugi, Yokohama (JP); Noriko Inoue, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 365 days.

(21) Appl. No.: 09/662,648

(22) Filed: Sep. 14, 2000

(30) Foreign Application Priority Data

Sep. 17, 1999 (JP) ............................................ 11-264560

(51) Int. Cl.[7] .................... H03M 13/00; H04L 12/26; H04H 1/04; H04B 17/02
(52) U.S. Cl. ........................ 714/758; 370/252; 370/394; 370/486; 375/211
(58) Field of Search .................. 714/751, 748, 714/758, 781; 370/252, 394, 486; 375/200

(56) References Cited

U.S. PATENT DOCUMENTS

| | | | |
|---|---|---|---|
| 5,668,810 A | * 9/1997 | Cannella, Jr. ............... 370/392 |
| 5,677,918 A | 10/1997 | Tran et al. |
| 5,745,502 A | * 4/1998 | Khayrallah et al. ......... 714/751 |
| 5,826,032 A | * 10/1998 | Finn et al. ................... 709/236 |
| 5,844,918 A | * 12/1998 | Kato ........................... 714/751 |
| 5,850,405 A | * 12/1998 | Wimmer et al. ............ 714/790 |
| 5,862,160 A | * 1/1999 | Irvin et al. .................. 714/807 |
| 5,878,041 A | * 3/1999 | Yamanaka et al. ..... 370/395.65 |
| 5,968,197 A | * 10/1999 | Doiron ........................ 714/748 |
| 6,038,694 A | * 3/2000 | Swallow ..................... 714/781 |
| 6,052,812 A | * 4/2000 | Chen et al. ................. 714/751 |
| 6,126,310 A | * 10/2000 | Osthoff et al. ............. 714/751 |
| 6,212,660 B1 | * 4/2001 | Joeressen et al. .......... 714/758 |

FOREIGN PATENT DOCUMENTS

| | | |
|---|---|---|
| JP | 10-136019 | 5/1998 |
| JP | 10-313281 | 11/1998 |
| WO | WO 95/19080 | 7/1995 |

* cited by examiner

*Primary Examiner*—Albert Decady
*Assistant Examiner*—Anthony T. Whittington
(74) *Attorney, Agent, or Firm*—Oblon, Spivak, McClelland, Maier & Neustadt, P.C.

(57) ABSTRACT

When an error is detected in a received packet, a higher application is informed that the error occurred, and when no error is detected in the received packet, the higher application is informed that the packet has been received. If a next packet is received while a packet having the detected error is stored in a data storing region, an acknowledge signal indicating that the packet cannot be received is sent to a source node, and the packet having the detected error stored in the data storing region is invalidated by a request from the higher application. When the error is detected in a received packet, that packet stored in the data storing region is invalidated.

12 Claims, 7 Drawing Sheets

FIG.8

# TRANSMITTING APPARATUS AND ERROR HANDLING METHOD IN TRANSMITTING APPARATUS

CROSS REFERENCE TO RELATED APPLICATIONS

This patent application claims for benefit of the filing date of Japanese Patent Application No. P11-264560 filed on Sep. 17, 1999, the entire contents of which are hereby incorporated by reference.

BACKGROUND OF THE INVENTION

1. Field of the Invention

The present invention relates to a transmitting apparatus having an error handling function in data transmission between a network and devices, and to an error handling method. More particularly, the invention relates to a link layer data transmitting apparatus adhering to "IEEE Standard for a High Performance Serial Bus (IEEE 1394-1995 Std., hereinafter)".

2. Description of the Related Art

In order to realize an inexpensive and high performance digital network by connecting peripheral devices of a computer apparatus and a consumer apparatus, or peripheral apparatuses with each other, IEEE 1394-1995 Std. is standardized by IEEE (Institute of Electrical and Electronics Engineers).

Figure 1:
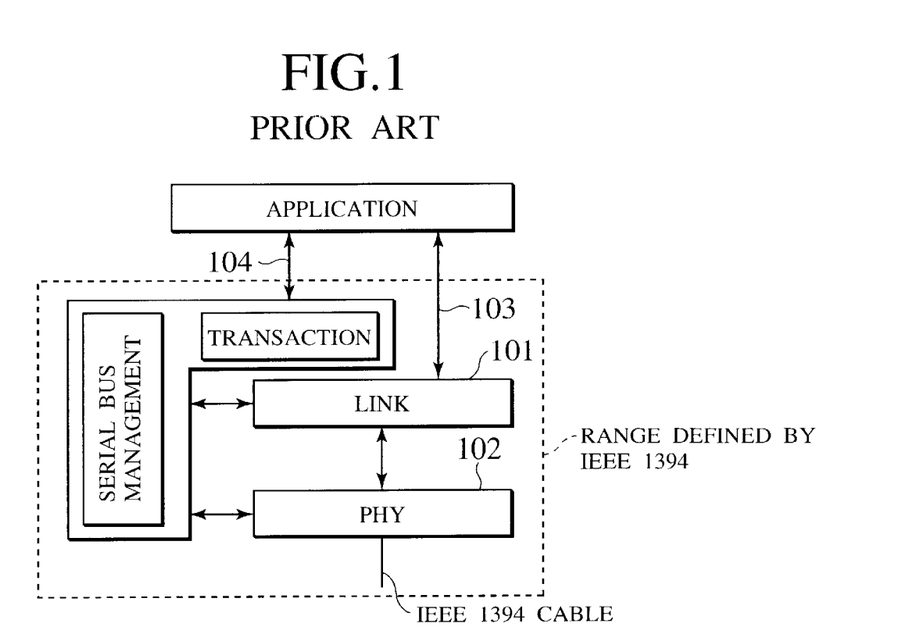
FIG. 1 is a block diagram showing a layered structure of a protocol defined by IEEE 1394-1955 Std.

A protocol defined by the IEEE 1394.a has a layered structure as shown in FIG. 1. In this protocol, a method for exchanging functions of layers such as PHY (Physical Layer) 102 and Link (Link Layer) 101, data and control information between the layers is defined as standard. As transmission mode, there exist an Isochronous transmission 103 for transmitting data at given intervals, and an Asynchronous transmission 104 for transmitting data at arbitrary time. A format of a packet (transmitted data) transmitted between nodes in each transmission mode is also defined.

Figure 2:
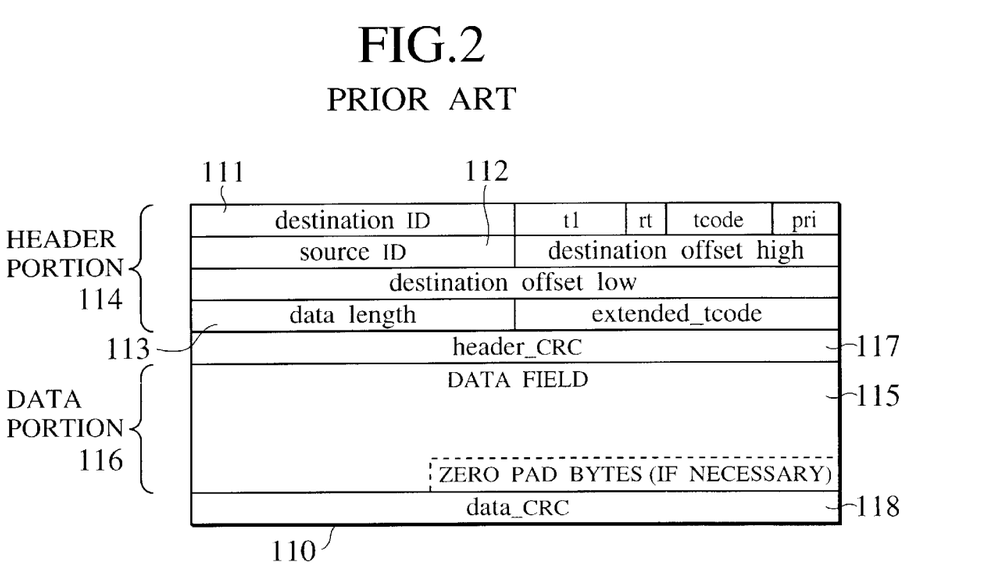
FIG. 2 is a layout diagram showing an example of packet format in an Asynchronous transmission.

An example of format of the packet of the Asynchronous transmission 104 is shown in FIG. 2.

The packet 110 comprises a fixed-length header portion 114 having a destination ID 111, a source ID 112 and a data length 113; and a variable-length data section 116 having a data field 115. The actual length of the data field 115 can be recognized by referring to the data length 113 of the fixed-length header portion 114.

In order to detect an error, a header CRC (Cyclic Redundancy Check) 117 is added to the end of the header portion, and a data CRC 118 is added to the end of a data portion.

Figure 3:
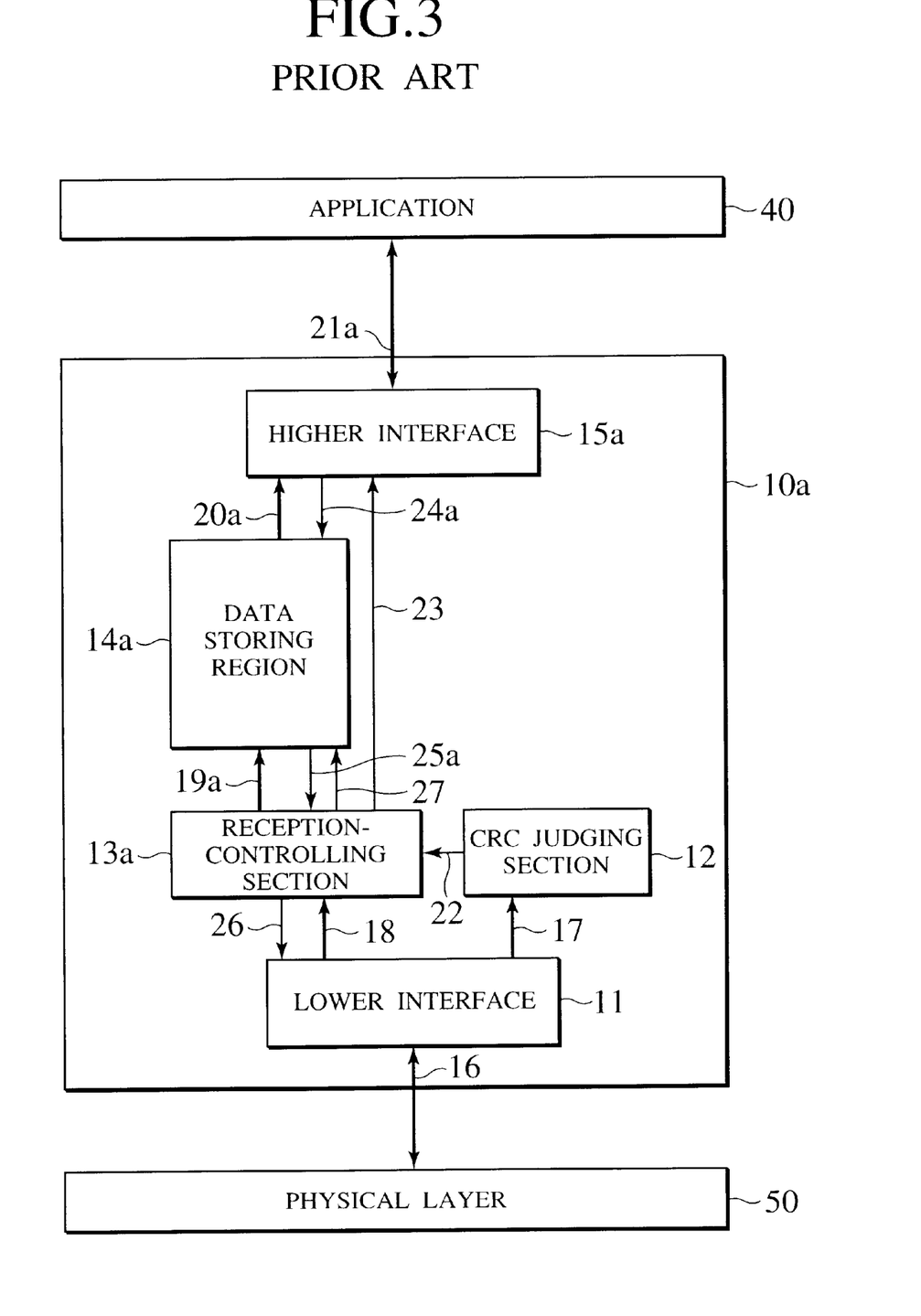
FIG. 3 is a block diagram showing an example of packet format in a conventional transmission apparatus.
Figure 4:
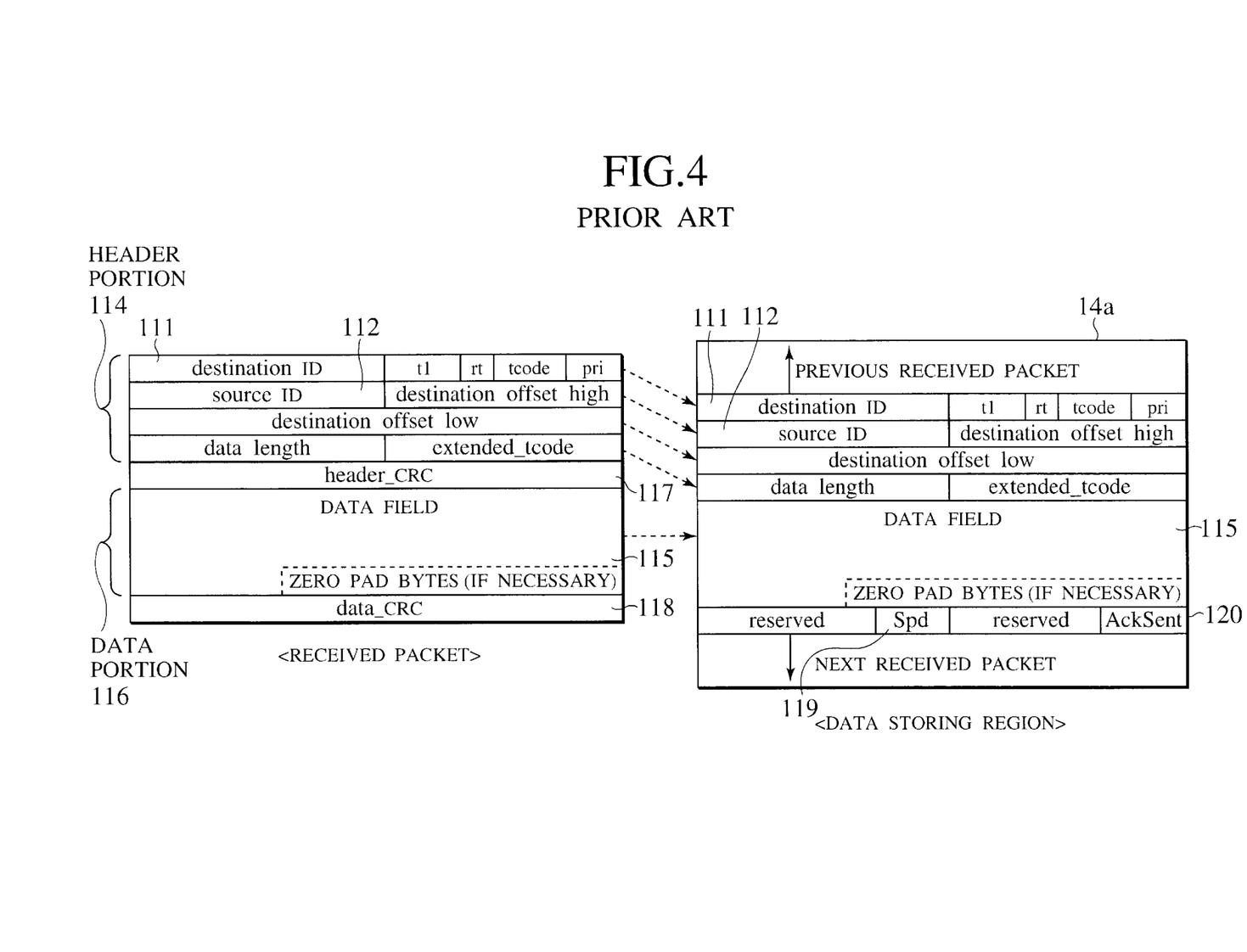
FIG. 4 is a schematic diagram showing a storage state of data in a data storing region in the transmission apparatus shown in FIG. 3.
Figure 5:
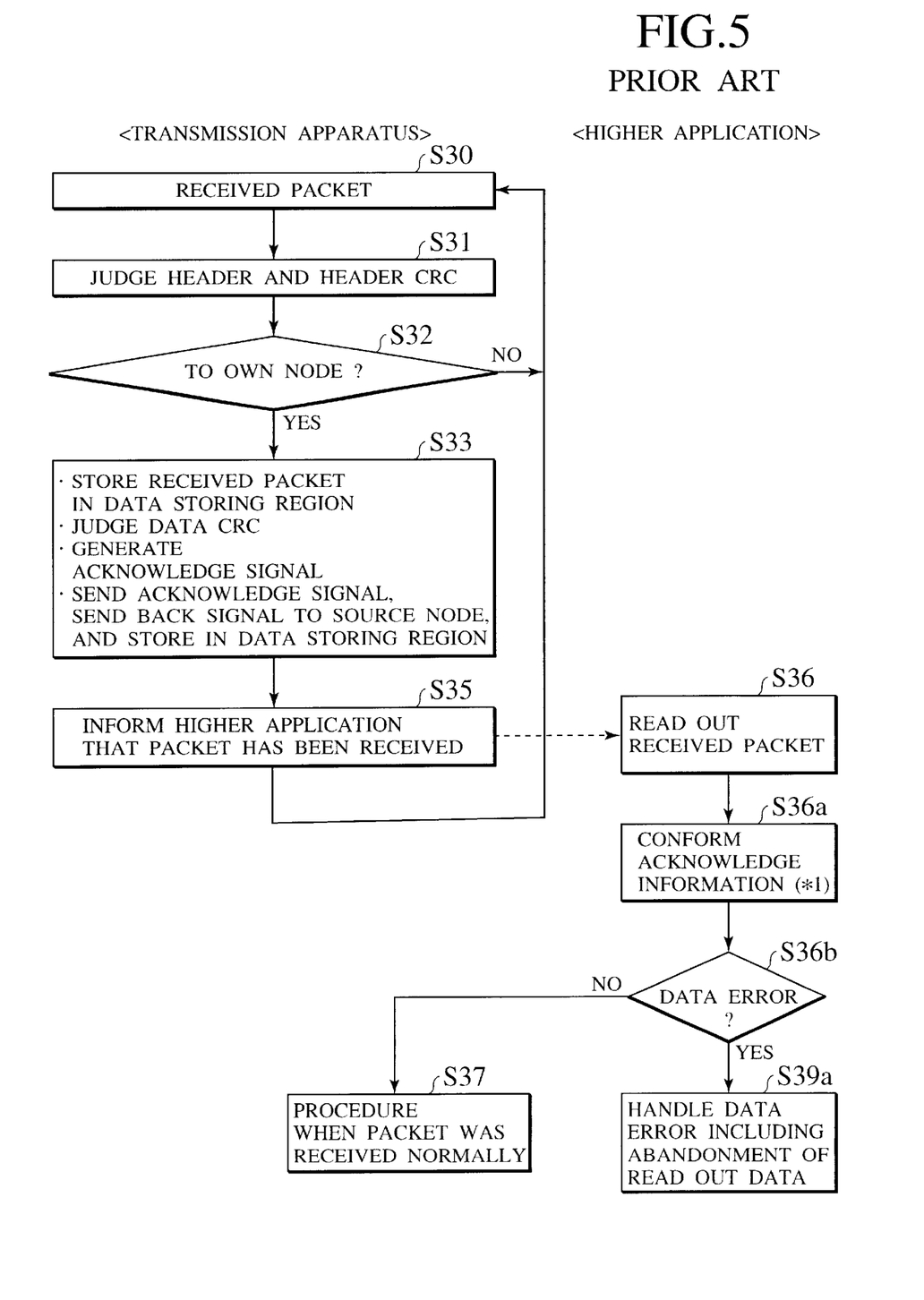
FIG. 5 is a flowchart showing conventional handling procedure in the transmission apparatus shown in FIG. 3.

Next, an example of a link layer transmitting apparatus adhering to the IEEE 1394-1995 Std., p1394.a is shown in FIG. 3, and an example of operation thereof is shown in FIG. 5. A state of stored data in a data storing region 14a is shown in FIG. 4.

The transmitting apparatus 10a comprises a lower interface 11, a CRC judging section 12, a reception-controlling section 13a, and the data storing region 14a and a higher interface 15a.

When the lower interface 11 receives data through a data signal 16 (step S30), the lower interface 11 transmits a packet received through a data signal 17 and a data signal 18 to the CRC judging section 12 and the reception-controlling section 13a.

The reception-controlling section 13a refers to the header portion 114 of the received packet 110 (step S31), and judges whether the received data is directed to the own node (step S32). If the data is directed to the own node, a reception packet is formed and stored in the data storing region 14a (FIFO/RAM) through a data signal 19a, and waits a result of CRC error judgment from the CRC judging section 12.

The CRC judging section 12 judges whether there is a CRC error in the received packet 110, and transmits the judgment result to the reception-controlling section 13a through a control signal 22.

The reception-controlling section 13a generates an acknowledge signal to be returned to the source node based on the CRC judgment result, transmits the acknowledge signal 26 to the lower interface 11, and stores the same in acknowledge information 120 (AckSent) of the data storing region 14a. Further, the reception-controlling section 13a informs the higher interface 15a that the reception was completed, and the higher interface 15a informs higher application 45 (step S33, step S35).

The header portion 114 and the data portion 116 of the received packet 110 are sequentially stored in the data storing region 14a. A speed information 119 (Spd) of the corresponding packet 110 and an acknowledge signal sent back to the source with respect to the corresponding received packet are added to the end of the data portion as the acknowledge information 120 (AckSent). The header CRC 117 and a data CRC 118 of the received packet 110 are eliminated. A plurality of received packets 110 can be stored in the data storing region 14a.

The acknowledge signal 26 to be sent back to the source and the acknowledge information 120 to be stored in the data region are defined as follows: "complete": reception completion (no responding packet exists), "pending": reception completion (responding packet exists), "busy": own node is busy and packet could not be received, "data error": there was error in the received packet.

When the higher application 40 is informed by the transmitting apparatus 10a that a packet has been received, the higher application 40 reads out data from the data storing region 14a through the higher interface 15a (step S36). At that time, the acknowledge information 120 can be referred based on the data length 113 stored in the data storing region 14a, and it is possible to judge whether there is an error in the received packet (steps S36 to S36b).

However, the above-described transmitting apparatus has the following problems.

Firstly, since the acknowledge information is located behind the data portion, even if the CRC error is detected in the received packet in the transmitting apparatus, the higher application can not recognize that the CRC error is occurred until all the data in the packet is read in. Therefore, it is necessary to read in all the data including unnecessary error data, and especially when a packet having large data length is processed, the processing time of the higher application is largely increased.

Secondly, even when a normal packet having no error was received and the higher application was informed that the reception of the packet had been completed, the higher application can not utilize the packet. until the application read all the data in the packet and confirms the acknowledge information. For example, when the application desires to utilize only the top of the data portion, the higher application must read in all the data including the unnecessary portion.

Thirdly, when an error is occurred in the reception packet and data length in the header portion of the packet and the actual data length are different, it is impossible to recognize where of the data storing region the acknowledge information is stored. Therefore, there is an adverse possibility that the higher application can not precisely judges whether there is an error in the received packet of the application erroneously judges.

Fourthly, like the third problem, when data length in the header portion of the packet and the actual data length are different, if the next packet is received and stored in the data storing region in the state in which the packet having the error remains in the state storing region, a data storing-starting position of this packet data can not be recognized.

SUMMARY OF THE INVENTION

The present invention has been accomplished to solve the above-described conventional problems, and it is an object of the invention is to provide a transmission apparatus having an error handling function and an error handling method capable of recognizing whether a data CRC error is occurred without reading out all the received data, and in which no malfunction occurs even when data length in the header portion of the packet and the actual data length are different.

To achieve the above object, a first aspect of the present invention is characterized in that when an error was detected in a received packet, a higher application is informed that the error was occurred, and when no error was detected in the received packet, a higher application is informed that a packet has been received.

According to the first aspect, when there is a data CRC error, the error occurrence information is transmitted, and when there is no error, the reception completion information is transmitted so that the processing can clearly be distinguished. Therefore, the higher application can recognize that the CRC error is occurred without reading all the data in the received packet by the error occurrence information or the reception completion information. Therefore, the processing time of the higher application 40 can be reduced. Further, since it is unnecessary to refer an acknowledge information in the data region, data can be processed even when data length in the header portion of the packet and the actual data length are different.

A second aspect of the present invention is characterized in that if a next packet is received while the packet having a detected error is stored in said data storing region, the packet stored in the data storing region is invalidated by a request from the higher application, thereby sending back, to the source node, an acknowledge signal indicating that the packet can not be received.

According to the second aspect, as long as an error packet remains in the data storing region, a next packet is not received. Therefore, even when data length in the header portion of the packet and the actual data length are different, a problem that a data storing-starting position of this packet data can not be recognized is overcome.

A third aspect of the invention is characterized in that when the error-detecting means detected an error, the corresponding packet stored in the data storing region is invalidated at that time. When the packet is invalidated, only the data portion may be invalidated.

According to the third aspect, only a normal packet, or the normal packet and an error packet having only the header portion are stored in the data storing region. Therefore, even when data length in the header portion of the packet and the actual data length are different, a problem that a data storing-starting position of this packet data cannot be recognized is overcome.

Other and further objects and features of this invention will be become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE PREFERRED EMBODIMENTS

Embodiments of the present invention will be explained based on the drawings below.

Figure 6:
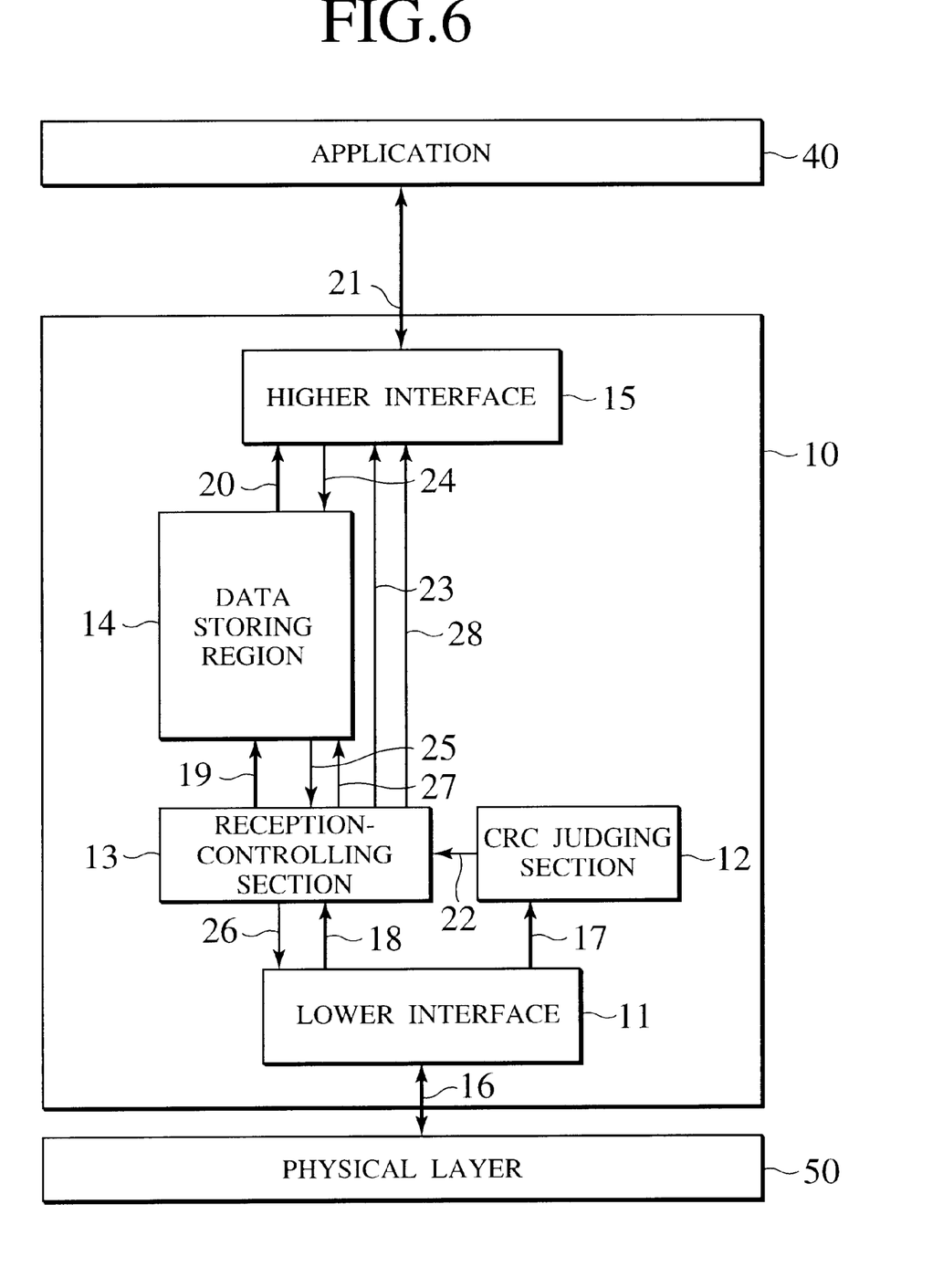
FIG. 6 is a block diagram showing an embodiment of the transmission apparatus having an error handling function of the present invention.

FIG. 6 is a block diagram showing one embodiment of a transmission apparatus according to the present invention.

A transmission apparatus 10 shown in FIG. 6 comprises a lower interface 11, a CRC judging section 12, a reception-controlling section 13, a data storing region 14, and a higher interface 15.

The lower interface 11 is connected to a physical layer 50 of the own node or directly connected to another node, and forms data (packet) received by the physical layer 50 of the own node or the other node into a form capable of being utilized in the transmission apparatus 10, and on the contrary, forms data output from the transmission apparatus 10 into a form capable of being transmitted to the physical layer 50 of the own node or the other node, and adjusts bus to the physical layer 50 of the own node or the other node.

The CRC judging section 12 judges whether there is a CRC error in the received data input from the lower interface 11.

The reception-controlling section 13 judges whether the received data input from the lower interface 11 is for the own node. If the received data is for the own node, the reception-controlling section 13 forms the received data in the data storing region 14 and store the data therein. In accordance with a result of judgment of the CRC judging section 12, the reception-controlling section 13 generates the acknowledge signal ("complete", "busy", "error" and the like) with respect to the source node, and transmits the same to the lower interface 11 and the data storing region 14. Further, in accordance with the result of judgment of the CRC judging section 12, the reception-controlling section 13 informs the higher interface 15 that the error was occurred or the reception was completed.

The data storing region 14 inputs and stores the received data which was judged to be for the own node by the reception-controlling section 13. The data storing region 14 outputs, to the higher interface 15, the data stored by the request from the higher interface 15.

The higher interface 15 is connected to the higher application 40 such as MPU (Micro Processing Unit)/CPU (Central Processing Unit), transmits data stored in the data storing region 14 by the request from the higher application 40 or controls various signals for controlling the transmission apparatus 10 from the higher application 40.

[EMBODIMENT 1]

Figure 7:
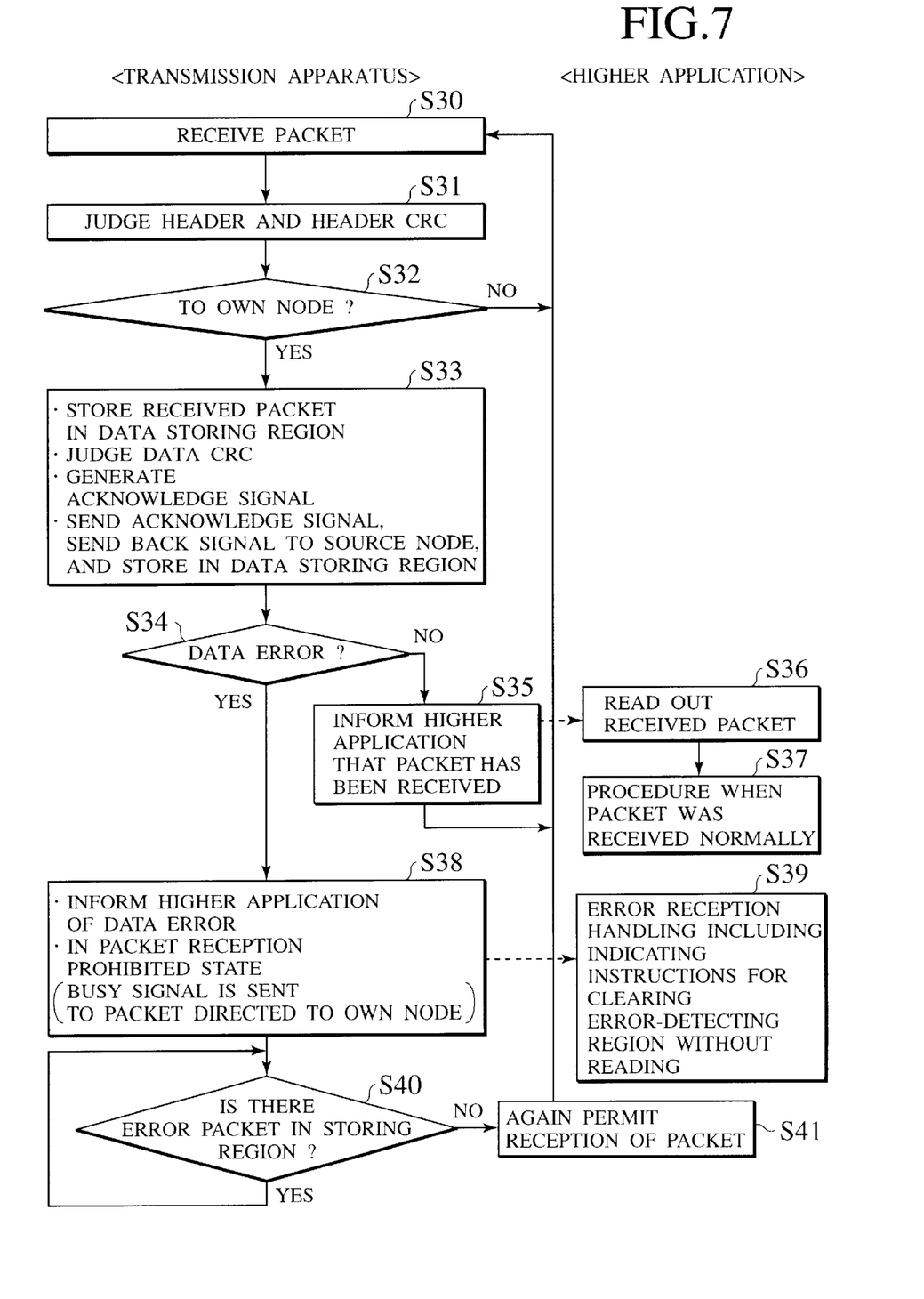
FIG. 7 is a flowchart showing handling procedure of an error handling method of a first embodiment of the invention in the transmission apparatus shown in FIG. 6.

In accordance with the block diagram in FIG. 6 and the flowchart in FIG. 7, an example of the receiving error handling operation of the packet according to the transmission apparatus 10 of the invention will be explained.

Data is received in the lower interface 11 from the physical layer 50 of the own node connected to the lower interface 11 or from the other node by the data signal 16 (step S30). The lower interface 11 forms the received packet into a form capable of being utilized in the transmission apparatus 10, and transmits the same to the CRC judging section 12 and the reception-controlling section 13 through the data signal 17 and the data signal 18.

The reception-controlling section 13 refers to the source node ID 111, and judges whether this received data is for the own node (steps S31 to S32). If the data is for the own node, the received data is written in the data storing region 14 by a data signal 19 in a form shown in FIG. 4, and the reception-controlling section 13 waits a result of judgment of CRC error of the received data from the CRC judging section 12.

The CRC judging section 12 judges whether there is data CRC error in the received data by the data CRC 18 of the data portion 116 of the received data, and transmits a result of judgment to the reception-controlling section 13 through the control signal 22.

The reception-controlling section 13 generates acknowledge information to be sent back to the source node based on the result of judgment from the CRC judging section 12, transmits the information to the lower interface 11 through the acknowledge signal 26, and writes the acknowledge signal 27 into the data storing region 14 (step S33). At the same time, when the judgment result of the data CRC from the CRC judging section 12 is normal, the reception-controlling section 13 informs the higher interface 15 through the control signal 23 that the packet has been received (step S34), and when the result of judgment of the data CRC from the CRC judging section 12 is error, the reception-controlling section 13 informs the higher interface 15 through a control signal 28 that the error was occurred in the packet (step S34).

The higher interface 15 informed that the reception was completed or the error was occurred informs the higher application 40 to that result (step S35).

The higher application 40 informed of the reception completion from the higher interface 15 reads out the received packet stored in the data storing region 14 through the higher interface 15 by a data signal 20 and data signal 21, so that the packet can be utilized (steps S36 to S37).

When the reception-controlling section 13 inform the higher interface 15 that the error was occurred, the reception-controlling section 13 may inform the higher interface 15 that the reception was completed. That is, the reception completion information and the error occurrence information may be not transmitted exclusively. The higher application 40 can recognize that data CRC error is not occurred even from the fact that error occurrence information was not transmitted.

When the reception-controlling section 13 inform that the error was occurred and the packet having the data CRC error is stored in the data storing region 14, the reception-controlling section 13 is brought into a packet reception prohibited state. In this case, the reception-controlling section 13 even if the lower interface 11 receives a new packet directed to the own node, the reception-controlling section 13 sends back the acknowledge information meaning "busy" to the source node, and the new packet is prevented from being written into the data storing region 14 (step S38).

The higher application 40 which received the error occurrence information from the higher interface 15 can also read out the error data stored in the data storing region 14 through the higher interface 15, or can judge that this data is unnecessary due to error and can request the higher interface 15 to invalidate (clear, for example) the data in the data storing region 14 (step S39). The requested higher interface 15 clears the error data stored in the data storing region 14 through a control signal 24.

If the error data stored in the data storing region 14 is read out or cleared by the higher application 40, the data storing region 14 informs the reception-controlling section 13 that the data was cleared through a control signal 25, the reception-controlling section 13 which received this information stops sending the acknowledge meaning "busy" to the received packet, and restarts the receiving operation of a new received packet. That is, when error data disappeared in the data storing region 14, the packet reception prohibited state is canceled, and a normal receiving procedure, is restored (steps S40 to S41).

As described above, in the conventional transmission apparatus, the reception completion information is transmitted to the higher application 40 irrespective of existence of data CRC error, and the higher application 40 knows whether there is an error from the acknowledge information in the data storing region. Whereas, in the transmission apparatus of the present invention, when there is a data CRC error, the error occurrence information is transmitted, and when there is no error, the reception completion information is transmitted so that the processing can clearly be distinguished. Therefore, the higher application 40 can recognize that the CRC error is occurred without reading all the data in the received packet by the error occurrence information or the reception completion information. Therefore, it is unnecessary to read unnecessary error data when the error was occurred, and especially when a packet having great data length is handled, the processing time of the higher application 40 can be reduced.

When only the reception completion information is transmitted, it is possible to recognize that data CRC error is not occurred. Therefore, it is unnecessary to read all the data in the packet to conform the acknowledge information, and the data can be utilized immediately. Therefore, when only the top portion of the data portion is to be utilized, it is sufficient for the higher application 40 to read out only the necessary data from the top.

Since it is possible to recognize whether the CRC error is occurred by the error occurrence information without referring to the acknowledge information, even if the data length in the header portion of the packet and the actual data length are different, the data can be processed without any problem.

In the state where the error packet is stored in the data storing region 14, a next or new packet is not received.

Therefore, even if the data length in the header portion of the packet and the actual data length are different, the problem that the data storing-starting position of the next packet can not be recognized is overcome. Further, when the higher application 40 is informed that the error was occurred, it is unnecessary to judge whether the next packet is received, and the data storing region 14 can be cleared.

[EMBODIMENT 2]

Figure 8:
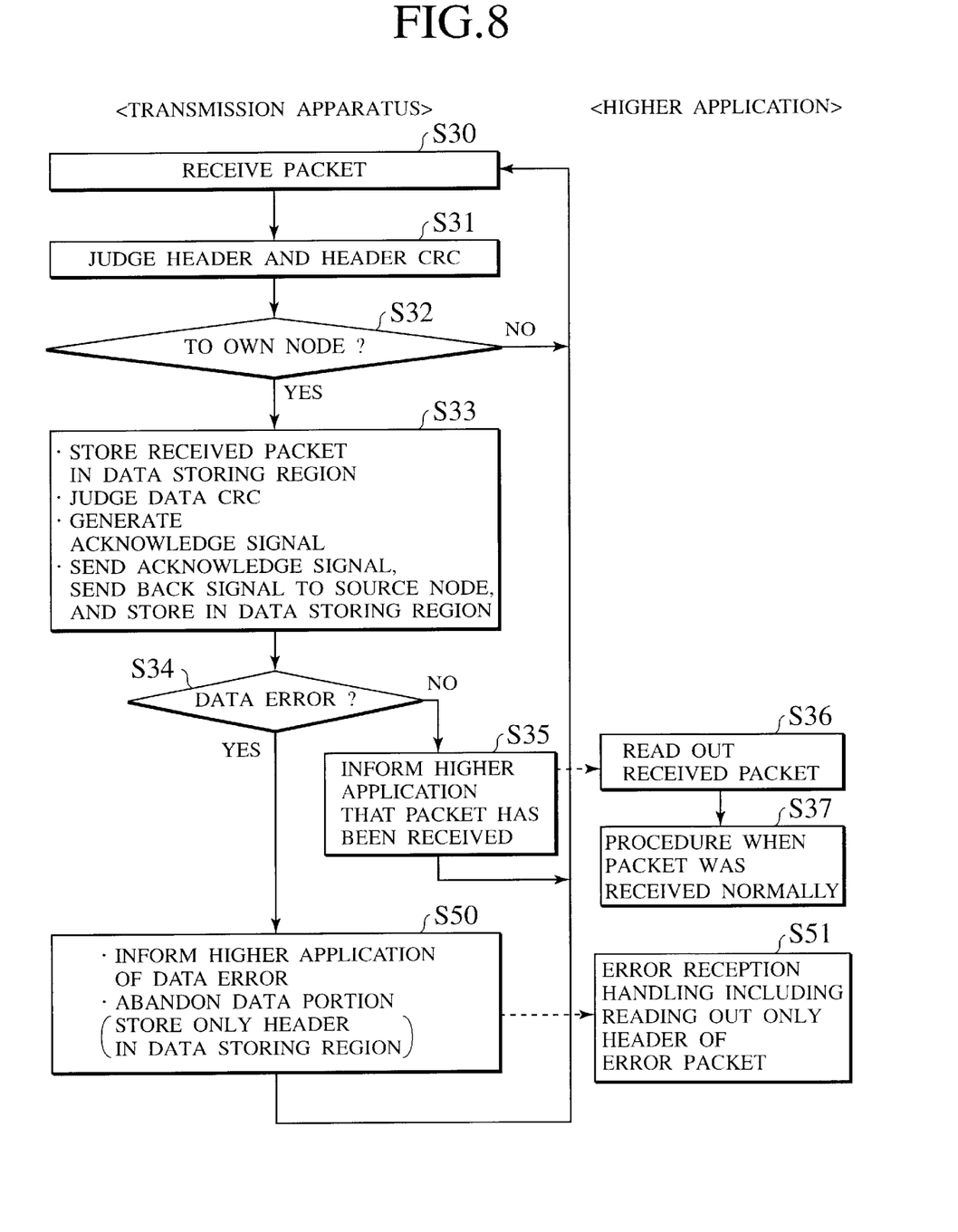
FIG. 8 is a flowchart showing handling procedure of an error handling method of a second embodiment of the invention in the transmission apparatus shown in FIG. 6.

Next, another example of operation of the transmission apparatus 10 of the invention will be explained with reference to the block diagram in FIG. 6 and the flowchart in FIG. 8.

Data is received in the lower interface 11 from the physical layer 40 of the own node connected to the lower interface 11 or from the other node by the data signal 16 (step S30). The lower interface 11 forms the received packet into a form capable of being utilized in the transmission apparatus 10, and transmits the same to the CRC judging section 12 and the reception-controlling section 13 through the data signal 17 and the data signal 18.

The reception-controlling section 13 refers to the source node ID 111, and judges whether this received data is for the own node (steps S31 to S32). If the data is for the own node, the received data is written in the data storing region 14 by a data signal 19 in a form shown in FIG. 4, and the reception-controlling section 13 waits a result of judgment of CRC error of the received data from the CRC judging section 12.

The CRC judging section 12 judges whether there is data CRC error in the received data, and transmits a result of judgment to the reception-controlling section 13 through the control signal 22.

The reception-controlling section 13 generates acknowledge information to be sent back to the source node based on the result of judgment from the CRC judging section 12, transmits the information to the lower interface 11 through the acknowledge signal 26, and writes the acknowledge signal 27 into the data storing region 14 (step S33). At the same time, when the judgment result of the data CRC from the CRC judging section 12 is normal, the reception-controlling section 13 informs the higher interface 15 through the control signal 23 that the packet has been received (step S34), and when the result of judgment of the data CRC from the CRC judging section 12 is error, the reception-controlling section 13 informs the higher interface 15 through a control signal 28 that the error was occurred in the packet (step S34).

The higher interface 15 informed that the reception was completed or the error was occurred informs the higher application 40 to that result (step S35).

The higher application 40 informed of the reception completion from the higher interface 15 reads out the received packet stored in the data storing region 14 through the higher interface 15 by a data signal 20 and data signal 21, so that the packet can be utilized (steps S36 to S37).

When the reception-controlling section 13 inform the higher interface 15 that the error was occurred, the reception-controlling section 13 may inform that the reception was completed. That is, the reception completion information and the error occurrence information may be not transmitted exclusively. The higher application 40 can recognize that data CRC error is not occurred even from the fact that error occurrence information was not transmitted.

The reception-controlling section 13 transmits the error occurrence information to the higher interface 15 and at the same time, deletes the data portion except the header portion of the received packet written into the data storing region 14 (step S50). The reception-controlling section 13 may also deletes all the data in the received packet written into the data storing region 14 in addition to the data portion.

The higher application 40 which received the error occurrence information from the higher interface 15 can also read out the header portion of the error data stored in the data storing region 14 through the higher interface 15, or can judge that this data is unnecessary due to error and can request the higher interface 15 to invalidate (clear, for example) the header portion data in the data storing region 14 (step S51). The requested higher interface 15 clears the error data stored in the data storing region 14 through a control signal 24.

As described above, in the transmission apparatus of the present invention, when there is a data CRC error, the error occurrence information is transmitted, and when there is no error, the reception completion information is transmitted so that the processing can clearly be distinguished. Therefore, the higher application can recognize that the CRC error is occurred without reading all the data in the received packet by the error occurrence information or the reception completion information. Therefore, it is unnecessary to read unnecessary error data when the error was occurred, and especially when a packet having great data length is handled, the processing time of the higher application 40 can be reduced.

When only the reception completion information is transmitted, it is possible to recognize that data CRC error is not occurred. Therefore, it is unnecessary to read all the data in the packet to conform the acknowledge information, and the data can be utilized immediately. Therefore, when only the top portion of the data portion is to be utilized, it is sufficient for the higher application 40 to read out only the necessary data from the top.

Since it is possible to recognize whether the CRC error is occurred by the error occurrence information without referring to the acknowledge information, even if the data length in the header portion of the packet and the actual data length are different, the data can be processed without any problem.

Further, in the present embodiment, the error data to be stored in the data storing region is only the header portion having the fixed length, even when the error packet is stored in the data storing region 14, a next received packet can be written in succession after the error data. Therefore, even if the next packet is written after the error data, a problem that the next packet may be stored in a wrong position is not caused. Further, when the error header data is cleared, a problem that another packet is also cleared or error data to be cleared remains is not caused.

Further, since it is unnecessary to send back a busy acknowledge to the received packet wastefully, it is possible to reduce the number of transaction flowing through a bus as compared with the first embodiment, and the bus can be utilized effectively.

Although the transmission apparatus having the error handling function and the error handling method of the present invention have been explained in detail using the first and second embodiment, the present invention is not limited to the embodiments, and various improvements and modification can be made without departing from a subject matter of the invention.

What is claimed is:

1. A transmission apparatus comprising:
   a receiving unit connected to a source of a packet and configured to receive the packet from said source,
   an error-detecting unit configured to detect an error in the packet received by said receiving unit, a controlling unit configured to store said packet received by said receiving unit in a data storing region, and to generate an acknowledge signal based on a result of an error detection of said error-detecting unit and to send the acknowledge signal to said source of said packet and said data storing region, and a sending unit connected to outside and configured to send said packet stored in said data storing region to the outside in accordance with a request from the outside, wherein said controlling unit informs said sending unit that a receiving operation was completed through a first control signal different from said acknowledge signal when an error was not detected in said packet, and informs said sending unit that an error has occurred through a second control signal different from said acknowledge signal when an error was detected in said packet, based on the result of the error detection of the error-detecting unit, and said sending unit informs the outside about a completion of the receiving operation informed by said controlling unit, and informs the outside about the occurrence of the error informed by said controlling unit.

2. A transmission apparatus according to claim 1, wherein said controlling unit has a function for exclusively informing the sending unit that the error has occurred when the error was detected in said packet, and informing the sending unit that the receiving operation has completed when the error was not detected in said packet.

3. A transmission apparatus according to claim 1 or 2, wherein if a next packet is received while the packet having a detected error is stored in said data storing region, said controlling unit sends a busy signal to said source to prevent said next packet from being written into said data storing region.

4. A transmission apparatus according to claim 1 or 2, wherein when said error-detecting unit detects an error in said packet, said controlling unit has a function to invalidate a portion of or entire packet stored in said data storing region.

5. A transmission apparatus comprising:

a lower interface connected to a source node for receiving the packet from said source node, an error-detecting section for detecting an error in the packet received by said lower interface, a controllign section for storing said packet received by said lower interface in a data storing region, and for generating an acknowledge signal based on a result of the error detection of said error-detecting section and sending the acknowledge signal to said source node of said packet and said data storing region, and a higher interface connected to a higher application for sending said packet stored in said data storing region to said higher application in accordance with a request from said higher application, wherein said controlling section informs said higher interface that a receiving operation has been completed through a first control signal different from said acknowledge signal when an error was not detected in said packet, and informs said higher interface that an error has occurred through a second control signal different from said acknowledge signal when an error was detected in said packet, based on the result of the error detection of the error-detecting section, and said higher interface informs said higher application about the completion of the receiving operation informed by said controlling section, and informs said higher application about the occurrence of the error informed by said controlling section.

6. A transmission apparatus according to claim 5, wherein said controlling section has a function for exclusively informing the higher interface that the error has occurred when the error was detected in said packet, and informing the higher interface that the receiving operating was completed when the error was not detected in said packet.

7. A transmission apparatus according to claim 5 or 6, wherein if a next packet is received while the packet having a detected error is stored in said data storing region, said controlling section sends a busy signal to said source node to prevent said next packet from being written into said data storing region.

8. A transmission apparatus according to claim 5 or 6, wherein when said error-detecting section detected an error in said packet, said controlling section has a function to invalidate a portion of or entire packet stored in said data storing region.

9. An error handling method comprising the steps of:

receiving a packet from a source, detecting an error of said received packet, storing said received packet in a data storing region, generating an acknowledge signal based on a result of the error detection and sending the acknowledge signal to said source of said packet and said data storing region, informing outside that a receiving operation has completed through a first control signal different from said acknowledge signal, informing the outside that an error has occurred in said packet through a second control signal different from said acknowledge signal when the error of the packet was detected as a result of the error detection of the packet, and transmitting the packet stored in said data storing region to the outside in accordance with a request from the outside.

10. An error handling method according to claim 9, wherein said step of informing that said packet has been received and said step of informing that an error has occurred in said packet are carried out exclusively.

11. An error handling method according to claim 9 or 10, further comprising a step of sending a busy signal to said source to prevent a next packet from being written into said data storing region if said next packet is received while the packet having a detected error is stored in said data storing region.

12. An error handling method according to claim 9 or 10, further comprising a step of invalidating a portion of or entire packet stored in said data storing region when the error is detected in said packet.

* * * * *